United States Patent
Qian et al.

(10) Patent No.: US 12,225,821 B1
(45) Date of Patent: Feb. 11, 2025

(54) METHOD OF MAKING ACOUSTIC DEVICES WITH EDGE CORRUGATION

(71) Applicant: Skyworks Global Pte. Ltd., Singapore (SG)

(72) Inventors: You Qian, Singapore (SG); Rakesh Kumar, Singapore (SG); Guofeng Chen, Fremont, CA (US); Myeong Gweon Gu, Seoul (KR); Myung Hyun Park, Seongnam-si (KR); Jae Hyung Lee, Seoul (KR); Michael Jon Wurtz, Lake Oswego, OR (US)

(73) Assignee: Skyworks Global Pte. Ltd., Singapore (SG)

( * ) Notice: Subject to any disclaimer, the term of this patent is extended or adjusted under 35 U.S.C. 154(b) by 524 days.

(21) Appl. No.: 17/647,213

(22) Filed: Jan. 6, 2022

Related U.S. Application Data

(60) Provisional application No. 63/134,866, filed on Jan. 7, 2021, provisional application No. 63/134,762, filed on Jan. 7, 2021.

(51) Int. Cl.
| | |
|---|---|
| *H10N 30/01* | (2023.01) |
| *B81B 3/00* | (2006.01) |
| *B81C 1/00* | (2006.01) |
| *H04R 17/02* | (2006.01) |
| *H04R 17/10* | (2006.01) |
| *H10N 30/30* | (2023.01) |

(52) U.S. Cl.
CPC .......... *H10N 30/01* (2023.02); *B81B 3/0021* (2013.01); *B81C 1/00134* (2013.01); *H04R 17/02* (2013.01); *H04R 17/10* (2013.01); *H10N 30/302* (2023.02); *B81B 2201/0257* (2013.01); *H04R 2201/003* (2013.01)

(58) Field of Classification Search
None
See application file for complete search history.

(56) References Cited

U.S. PATENT DOCUMENTS

| | | |
|---|---|---|
| 7,253,488 B2 | 8/2007 | Zhan et al. |
| 7,763,947 B2 | 7/2010 | Zhan et al. |
| 8,896,184 B2 | 11/2014 | Grosh et al. |
| 9,386,379 B2 | 7/2016 | Sparks et al. |

(Continued)

FOREIGN PATENT DOCUMENTS

| | | | | |
|---|---|---|---|---|
| CN | 110113703 | * | 8/2019 | ............ H04R 31/00 |
| WO | WO 2021098562 A1 | | 5/2021 | |

*Primary Examiner* — Hsien Ming Lee
(74) *Attorney, Agent, or Firm* — Knobbe, Martens, Olson & Bear LLP

(57) ABSTRACT

A method of making an acoustic sensor (e.g., for use in a piezoelectric MEMS microphone) includes forming or providing a mold having one or more grooves in a top surface of the mold that extend in a direction of the length of the mold to a distal end of the mold. The method also includes forming or depositing a structure having one or more piezoelectric layers over the top surface of the mold to define a beam, the distal portion of the beam having a corrugated section including one or more grooves that correspond to the grooves of the mold. The method also includes forming a gap in the structure to define two beams separated by the gap, and releasing the structure from the mold to form one or more cantilever beams that increases an acoustic resistance of the gap between sensors.

18 Claims, 14 Drawing Sheets

(56) References Cited

U.S. PATENT DOCUMENTS

| | | |
|---|---|---|
| 10,825,982 B1 | 11/2020 | Littrell et al. |
| 11,267,696 B2 * | 3/2022 | Nagarajan ............. B81C 1/0069 |
| 11,363,395 B1 * | 6/2022 | Toride ...................... H04R 1/46 |
| 11,818,540 B1 | 11/2023 | Qian et al. |
| 2019/0327562 A1 | 10/2019 | Cerini |
| 2021/0021936 A1 | 1/2021 | Hui et al. |
| 2021/0051413 A1 | 2/2021 | Hui et al. |
| 2021/0120345 A1 | 4/2021 | Hui et al. |
| 2021/0120346 A1 | 4/2021 | Hui et al. |
| 2022/0073342 A1 | 3/2022 | Ho |

\* cited by examiner

METHOD OF MAKING ACOUSTIC DEVICES WITH EDGE CORRUGATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to acoustic devices, such as piezoelectric microelectromechanical systems (MEMS) microphones, and in particular to methods of making acoustic devices with edge corrugation.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones include cantilever MEMS structures, and are mostly based on sputter-deposited thin film piezoelectric structure. Such thin piezoelectric film suffers from large residual stress and stress gradient across the film thickness after deposition, which results in sensitivity degradation and variation. The cantilever MEMS structure suffers from poor low-frequency roll-off control as the gap between cantilevers varies due to cantilever deflection induced by residual stress and stress gradient of the piezoelectric film for a single or multiple films stacked together. Additionally, the cantilever MEMS structure with gap control mechanism can have a complex structure that results in higher manufacturing costs and poor reliability performance.

SUMMARY

Accordingly, there is a need for an improved acoustic device with increased acoustic resistance that can be used, for example, in piezoelectric MEMS microphones and do not suffer the deficiencies in existing MEMS cantilever structures.

In accordance with an aspect of the present disclosure, an acoustic device (e.g., cantilever piezoelectric sensor) is provided with increased acoustic resistance that has edge corrugation. The acoustic device can be used, for example, in piezoelectric MEMS microphones.

In accordance with one aspect of the disclosure, a piezoelectric sensor for a piezoelectric microelectromechanical systems microphone is provided. The sensor comprises a substrate and a cantilever beam. The cantilever beam has a proximal portion attached to the substrate and a distal portion that extends from the proximal portion to a free end of the beam, the beam extending generally linearly from the proximal portion toward the free end in a first direction. The beam has a wall portion at or proximate the free end that extends in a second direction generally transverse to the first direction. An electrode is disposed on or in the proximal portion of the beam.

In accordance with another aspect of the disclosure, a piezoelectric microelectromechanical systems microphone is provided. The microphone comprises a substrate and a plurality of piezoelectric sensors movably coupled to the substrate. Each of the piezoelectric sensors are spaced apart from an adjacent piezoelectric sensor by a gap. Each sensor includes a cantilever beam having a proximal portion attached to the substrate and a distal portion that extends from the proximal portion to a free end of the beam, the beam extending generally linearly from the proximal portion toward the free end in a first direction. Sound pressure exerted on the beam causes the beam, including the corrugated section to bend. The beam has a wall portion at or proximate the free end that extends in a second direction generally transverse to the first direction. An electrode is disposed on or in the proximal portion of the beam. The plurality of piezoelectric sensors are configured to deflect when subjected to sound pressure.

In accordance with another aspect of the disclosure, an audio subsystem is provided. The audio subsystem comprises an audio codec and one or more piezoelectric microelectromechanical systems microphones in communication with the audio codec. Each microphone includes a substrate and a plurality of piezoelectric sensors movably coupled to the substrate. Each of the piezoelectric sensors are spaced apart from an adjacent piezoelectric sensor by a gap. Each piezoelectric sensor includes a cantilever beam having a proximal portion attached to the substrate and a distal portion that extends from the proximal portion to a free end of the beam, the beam extending generally linearly from the proximal portion toward the free end in a first direction. The beam has a wall portion at or proximate the free end that extends in a second direction generally transverse to the first direction. An electrode is disposed on or in the proximal portion of the beam.

In accordance with another aspect of the disclosure, an electronic device is provided. The electronic device comprises a processor and an audio subsystem that communicates with the processor. The audio subsystem comprises one or more piezoelectric microelectromechanical systems microphones. Each microphone includes a substrate and a plurality of piezoelectric sensors movably coupled to the substrate. Each of the piezoelectric sensors are spaced apart from an adjacent piezoelectric sensor by a gap. Each piezoelectric sensor includes a cantilever beam having a proximal portion attached to the substrate and a distal portion that extends from the proximal portion to a free end of the beam, the beam extending generally linearly from the proximal portion toward the free end in a first direction. The beam has a wall portion at or proximate the free end that extends in a second direction generally transverse to the first direction. An electrode is disposed on or in the proximal portion of the beam.

In accordance with another aspect of the disclosure, a method of making a piezoelectric sensor for a piezoelectric microelectromechanical systems microphone is provided. The method comprises forming or providing a mold extending along a length and having one or more grooves in a top surface of the mold, the one or more grooves extending in a direction of the width of the mold. The method also comprises forming or depositing a structure having one or more piezoelectric layers over the top surface of the mold to define a beam with a proximal portion and a distal portion, the distal portion having a corrugated section including one or more grooves that correspond to the one or more grooves of the mold. The method further comprises releasing the structure from the mold to form a cantilever.

In accordance with another aspect of the disclosure, a method of making an electronic device is provided. The method comprises forming or providing a printed circuit board that includes a substrate layer. The method also comprises forming or providing one or more piezoelectric microelectromechanical systems microphones via a process comprising (a) forming or providing a mold extending along a length and having one or more grooves in a top surface of the mold, the one or more grooves extending in a direction of the width of the mold, (b) forming or depositing a structure having one or more piezoelectric layers over the top surface of the mold to define a beam with a proximal portion and a distal portion, the distal portion having a corrugated section including one or more grooves that correspond to the one or more grooves of the mold, (c) releasing the structure from the mold, and (d) leaving a part of the structure attached to a substrate in a cantilevered manner to form a cantilever beam that deflects when subjected to sound pressure. The method also comprises mounting the one or more piezoelectric microelectromechanical systems microphones on the printed circuit board.

DETAILED DESCRIPTION

Figure 1:
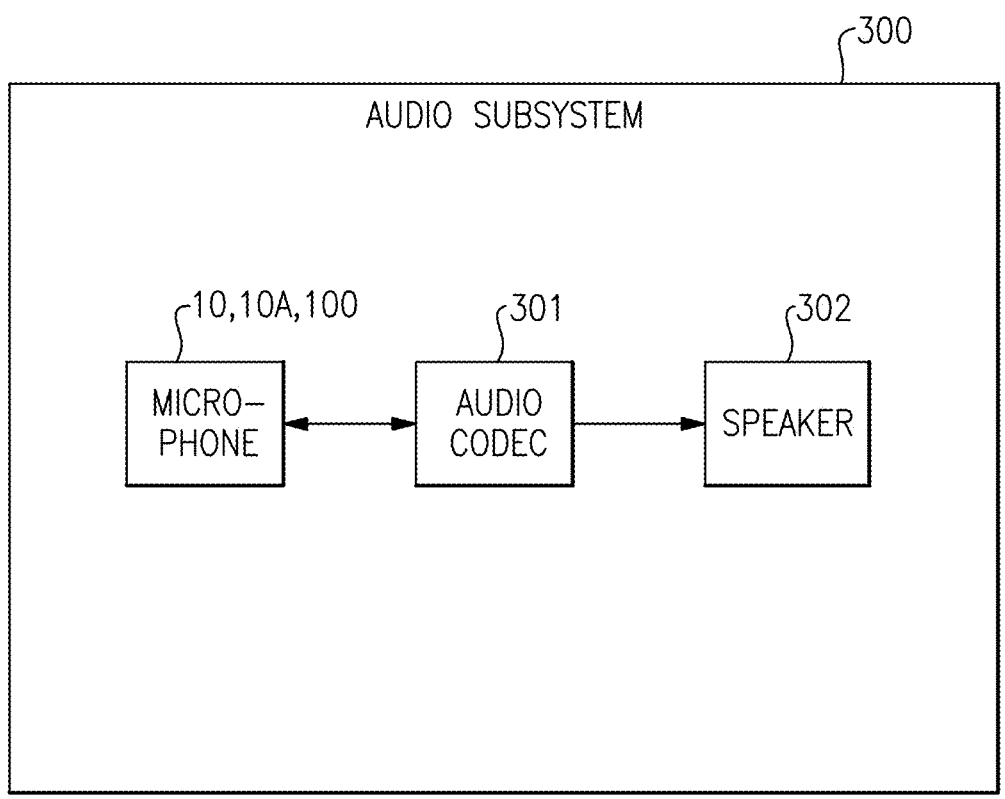
FIG. 1 is a schematic diagram of an audio subsystem.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of an audio subsystem 300. The audio subsystem 300 can include one or more microphones 10, 10A, 100. In one implementation, at least one of the microphone(s) 10, 10A, 100 is a piezoelectric MEMS microphone. The microphone(s) 10, 10A, 100 can communicate with an audio codec 301, which can control the operation of the microphone(s) 10, 10A, 100. The audio codec 301 can also communicate with a speaker 302 and control the operation of the speaker 302.

Figure 2A:
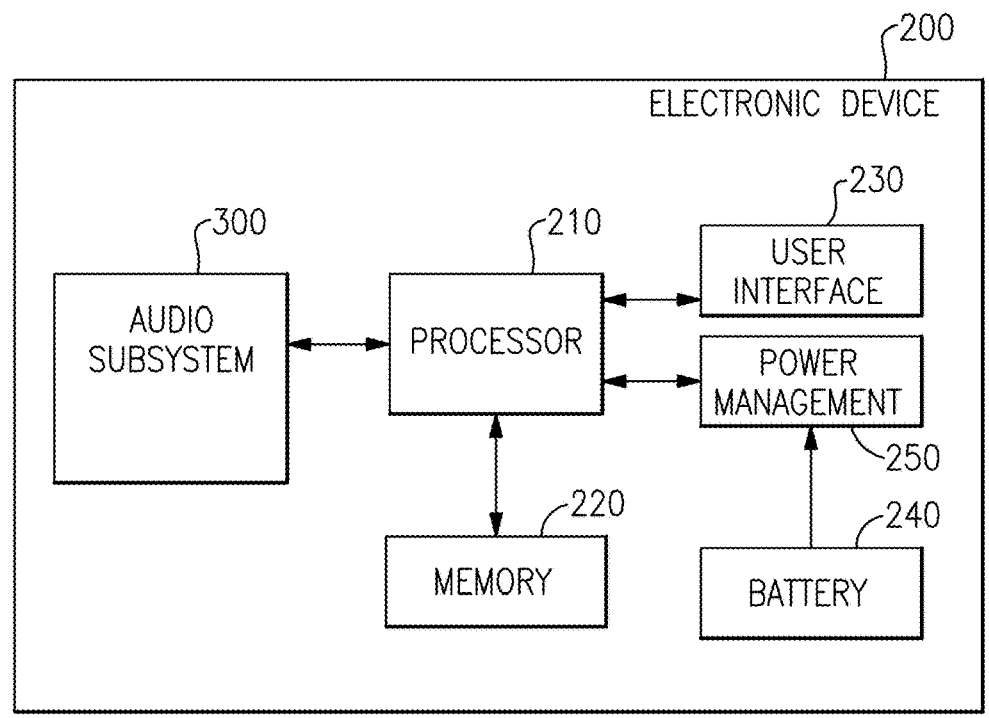
FIG. 2A is a schematic diagram of an electronic device.

FIG. 2A is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components of the electronic device 200.

The processor 210 communicates with the user interface 220 to facilitate processing of various user input and output (I/O), such as voice and data. As shown in FIG. 2A, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 2A, the power management system 250 receives a battery voltage from the battery 240. The battery 240 can be any suitable battery for use in the electronic device 200, including, for example, a lithium-ion battery.

Figure 2B:
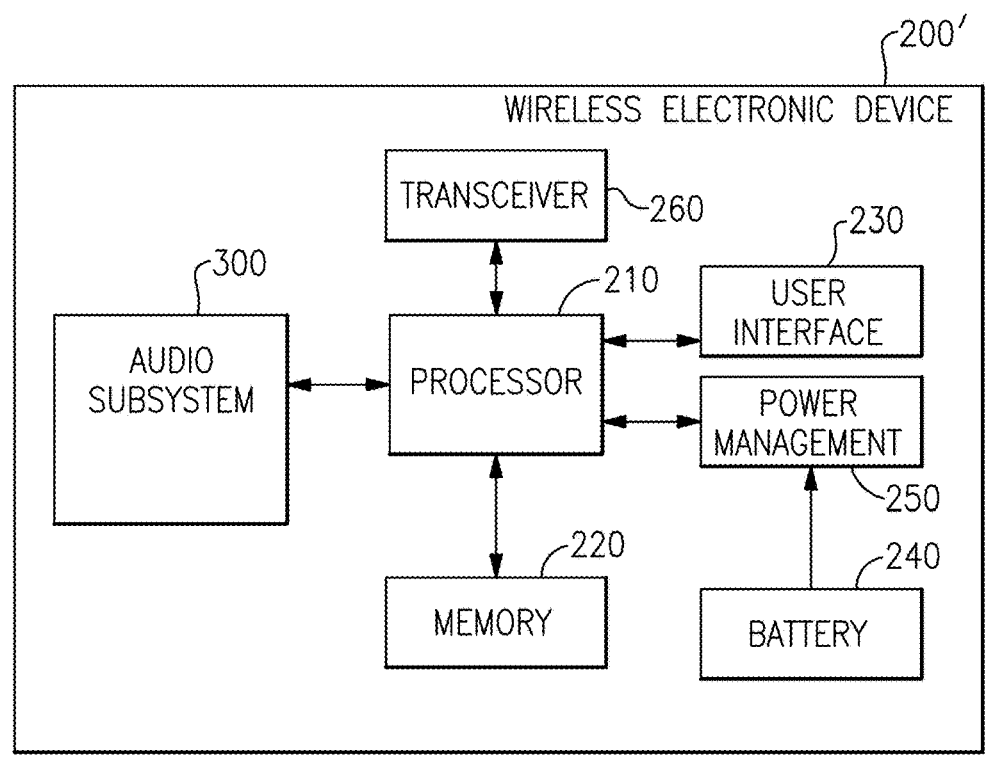
FIG. 2B is a schematic diagram of a wireless electronic device.

FIG. 2B is a schematic diagram of a wireless electronic device 200'. The wireless electronic device 200' is similar to the electronic device 200 in FIG. 2A. Thus, reference numerals used to designate the various components of the wireless electronic device 200' are identical to those used for identifying the corresponding components of the electronic device 200 in FIG. 2A. Therefore, the structure and description above for the various features of the electronic device 200 in FIG. 2A are understood to also apply to the corresponding features of the wireless electronic device 200' in FIG. 2B, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such a smartphone, tablet computer, etc.) is communicated to the processor 210, and signals, data and/or information provided by the processor 210 is communicated (e.g., wirelessly) by the transceiver 260 (e.g., to a remote electronic device). Further, the function of the transceiver 260 can be integrated into separate transmitter and receiver components.

The wireless electronic device 200' can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates wireless (e.g., RF) signals for transmission and processes incoming wireless (e.g., RF) signals received from antennas. It will be understood that various functionalities associated with the transmission and receiving of wireless (e.g., RF) signals can be achieved by one or more components that are collectively represented in FIG. 2B as the transceiver 260. In one example, separate components (for instance, separate circuits or dies) can be provided for handling certain types of wireless (e.g., RF) signals.

The processor 210 provides the transceiver 260 with digital representations of transmit signals, which the transceiver 260 processes to generate wireless (e.g., RF) signals for transmission. The processor 210 also processes digital representations of received signals provided by the transceiver 260.

Piezoelectric MEMS Microphone

Figure 3A:
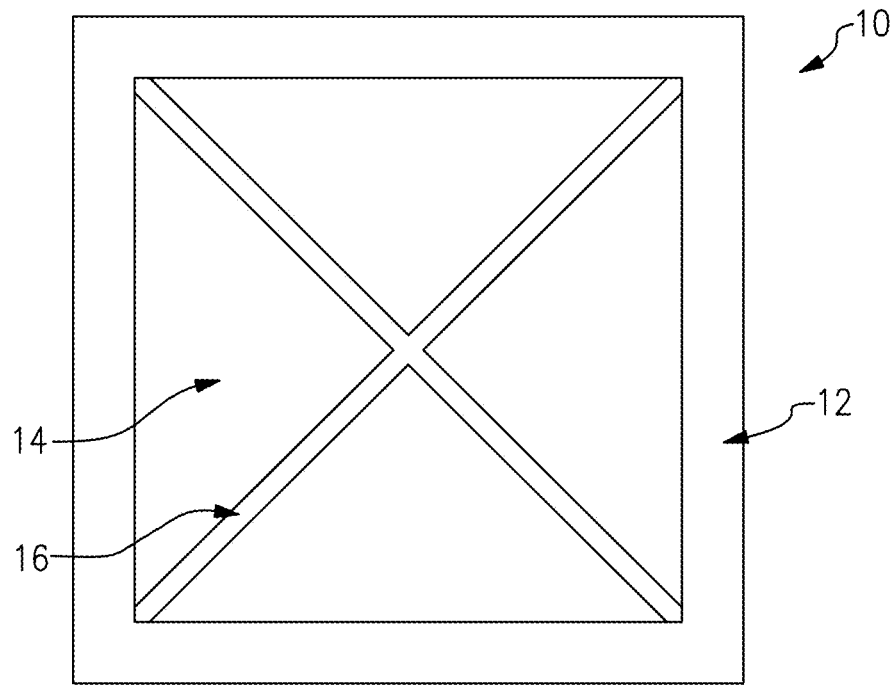
FIG. 3A is a schematic top view of a piezoelectric MEMS microphone.
Figure 3B:
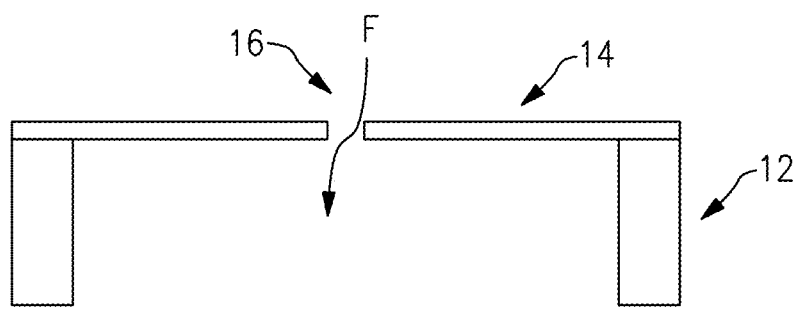
FIG. 3B is a schematic side view of the piezoelectric MEMS microphone of FIG. 3A.

FIGS. 3A-3B show a piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of piezoelectric material. Optionally, the sensors 14 can be made at least in part of Aluminum Nitride (AlN). In another implementation, the sensors 14 can optionally be made at least in part of Scandium Aluminum Nitride (ScAlN). In other implementations, the sensors 14 can optionally be made at least in part of one of the following piezoelectric materials: Zinc Oxide (ZnO), Lead Zirconate Titanate (PZT), Polyvinylidene fluoride (PVDF, Lithium Niobate ($LiNbO_3$), Barium Titanate ($BaTiO_3$), Lead Magnesium Niobate-Lead Titanate (PMN-PT). The sensors 14 can include an electrode, which can optionally be made of aluminum (Al), molybdenum (Mo), titanium (Ti), titanium nitride (TiN), platinum (Pt), tantalum (Ta) or ruthenium (Ru), in some implementations. The gaps 16 between the sensors 14 allow the sensors 14 to freely move, for airflow F to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Figure 4A:
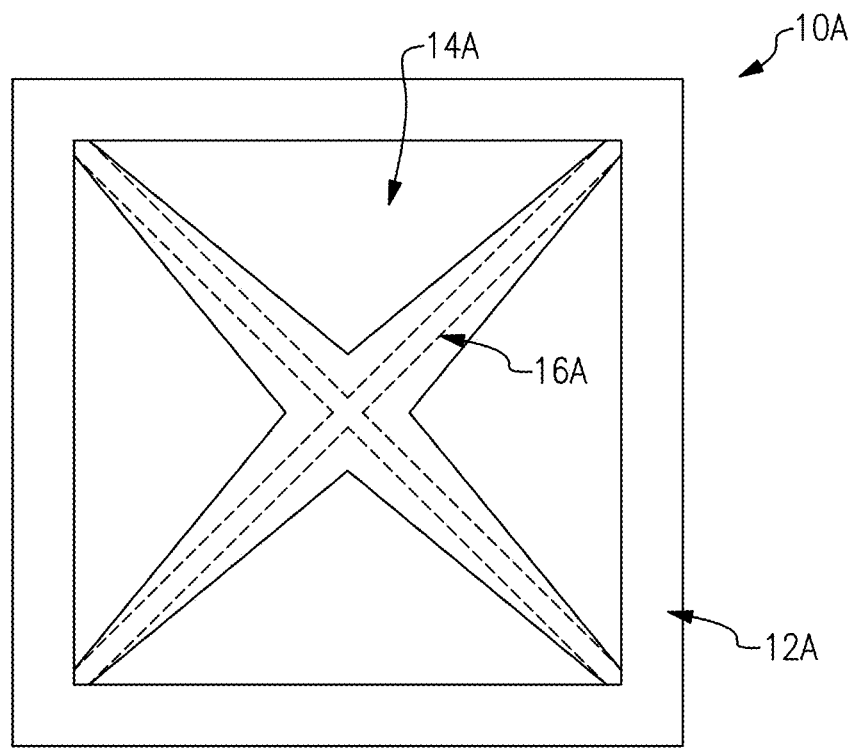
FIG. 4A is a schematic top view of a piezoelectric MEMS microphone.
Figure 4B:
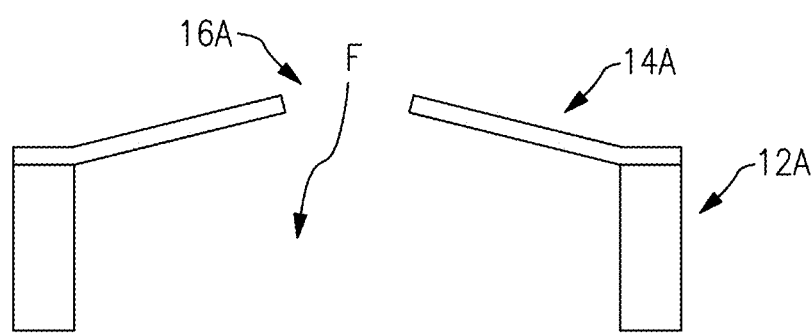
FIG. 4B is a schematic side view of the piezoelectric MEMS microphone of FIG. 4A.

FIGS. 4A-4B show a piezoelectric MEMS microphone 10A (hereinafter "microphone"). The microphone 10A is similar to the microphone 10 in FIGS. 3A-3B. Thus, references numerals used to designate the various components of the microphone 10A are identical to those used for identifying the corresponding components of the microphone 10 in FIGS. 3A-3B, except that an "A" has been added to the numerical identifier. Therefore, the structure and description for the various features of the microphone 10 in FIGS. 3A-3B are understood to also apply to the corresponding features of the microphone 10A in FIGS. 4A-4B, except as described below.

The microphone 10A differs from the microphone 10 in that the sensors 14A are bent upward due to the material's residual stress or stress gradient thereof, resulting in an increased width of the gaps 16A between sensors 14A. Though FIGS. 4A-4B show the sensors 14A bent upward, in other examples, the sensors 14A can be bent downward due to the material's residual stress or stress gradient thereof.

In use, the microphone 10, 10A is mounted on a printed circuit board (PCB) so that the substrate 12, 12A is disposed over or otherwise generally aligned with an opening in the PCB through which sound pressure enters the opening to deflect the sensors 14, 14A.

Figure 5:
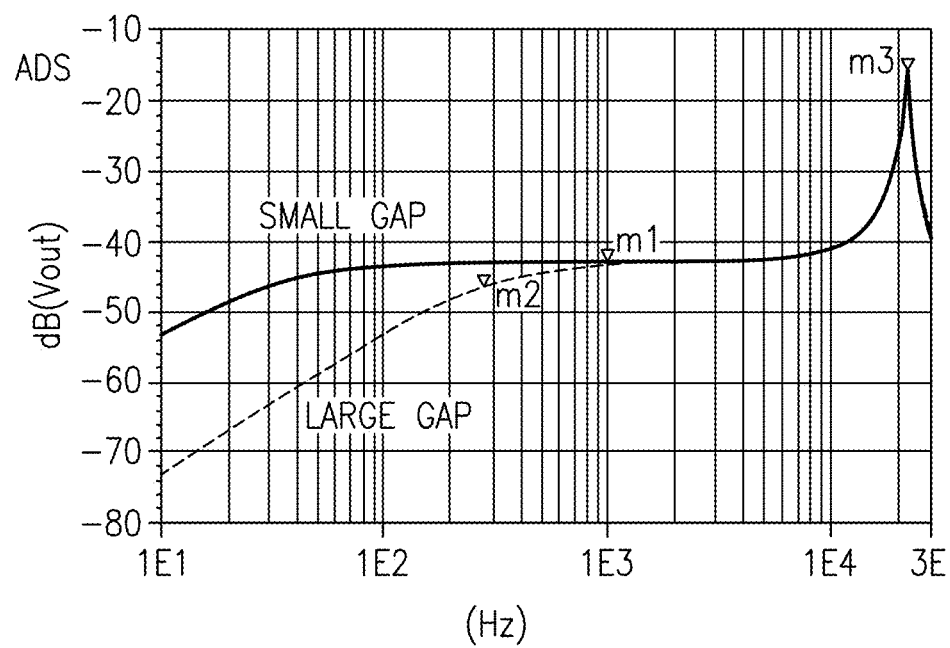
FIG. 5 is a graph of sensitivity versus frequency for the piezoelectric MEMS microphones in FIGS. 3A and 4A.
Figure 6:
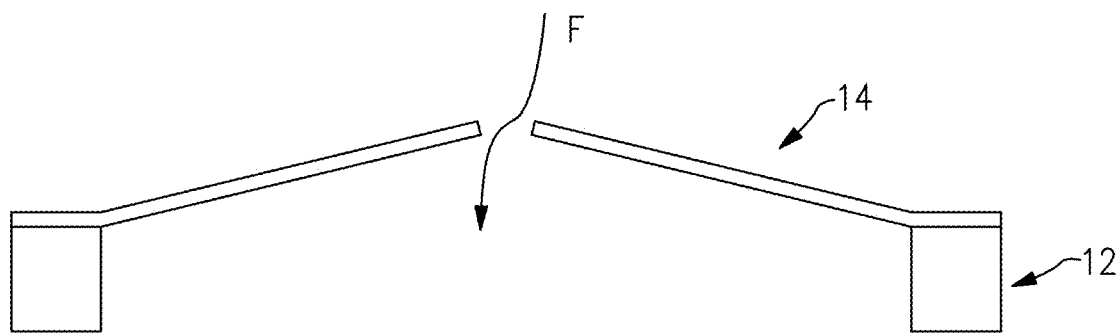
FIG. 6 is a schematic side view of a piezoelectric MEMS microphone where the piezoelectric sensors are deflected evenly.
Figure 7:
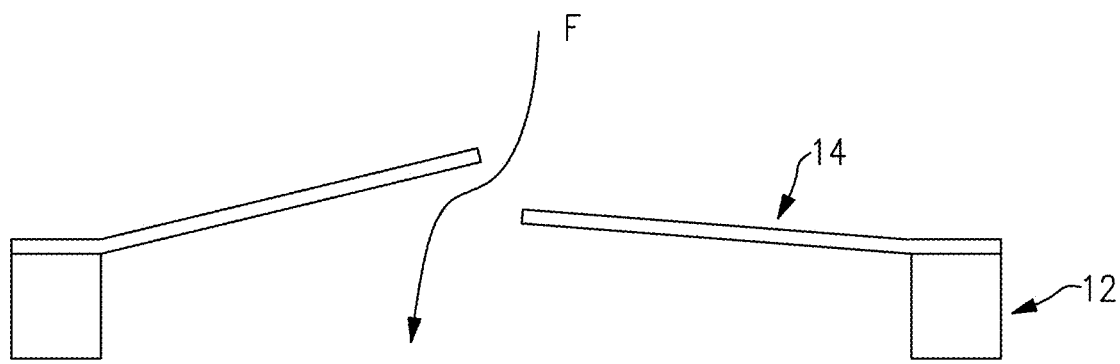
FIG. 7 is a schematic side view of a piezoelectric MEMS microphone where the piezoelectric sensors are deflected unevenly.

FIG. 5 shows a graph of sensitivity (in decibels or dB) versus frequency (in Hz). The solid line is representative of the performance of the microphone 10, where the sensors 14 are substantially planar (e.g. flat) and the gap 16 is substantially constant between the sensors 14 along their length. The dashed line is representative of the performance of the microphone 10A, where the sensors 14A are bent upward or downward and the width of the gap 16A varies between the sensors 14 along their length, which results in an increased reduction in acoustic resistance (e.g., because the gap 16A is larger). As shown in the graph, the performance of the microphone 10 provides better sensitivity in the low frequency range as compared to the performance of the microphone 10A. That is, changes in frequency in the low frequency range result in a smaller dB change for the microphone 10 than for the microphone 10A. FIGS. 6-7 shows a side view of the microphone 10 with the sensors 14 deflecting evenly (in FIG. 6) and the sensors 14 deflecting unevenly (in FIG. 7), for example, when subjected to sound pressure. As the sensors 14 deflect further (e.g., due to internal material stress gradient, due to sound pressure), the size of the gap (e.g., gap 16) between the sensors 14 increases, resulting in a reduction in acoustic resistance and drop in performance for the microphone 10.

Acoustic Device with Edge Corrugation

Figure 8A:
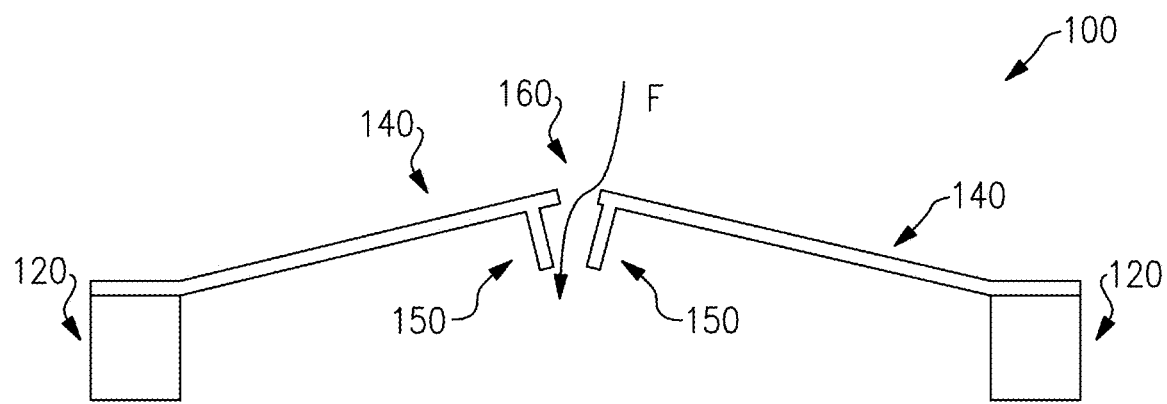
FIG. 8A is schematic side view of a piezoelectric MEMS microphone where the piezoelectric sensors are deflected evenly.
Figure 8B:
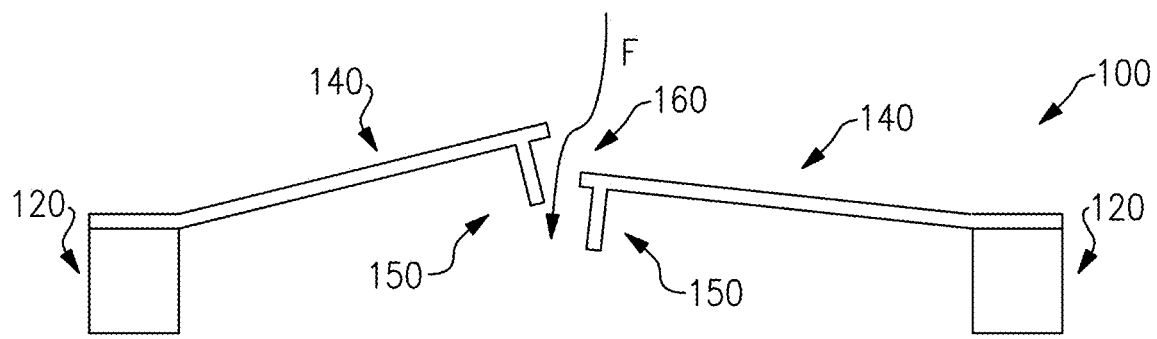
FIG. 8B is a schematic side view of a piezoelectric MEMS microphone where the piezoelectric sensors are deflected unevenly.

FIGS. 8A-8B show a schematic side view of a piezoelectric MEMS microphone 100 (hereinafter "microphone"). The microphone 100 is similar to the microphone 10 in FIGS. 3A-3B. Thus, references numerals used to designate the various components of the microphone 100 are identical to those used for identifying the corresponding components of the microphone 10 in FIGS. 3A-3B, except that an "0" has been added to the numerical identifier. Therefore, the structure and description for the various features of the microphone 10 in FIGS. 3A-3B are understood to also apply to the corresponding features of the microphone 100 in FIGS. 8A-8B, except as described below.

The microphone 100 differs from the microphone 10 in that a wall 150 extends generally transverse (e.g., perpendicular) to the beam of the sensor 140 proximate (e.g., near) the free or distal end of the sensor 140. In some implementations, the wall 150 can be at the free or distal end of the sensor 140. In some implementations, the wall 150 can extend from a bottom side of the sensor 140. In other implementations, the wall 150 can extend from a top side of the sensor 140. In still other implementations, the wall 150 can extend from both the top side and the bottom side of the sensor 140. The inventors have identified that the wall 150 increases acoustic resistance of the gap 160 between the sensors 140 (e.g., acts as a restriction to air flow F or flow resistance through the gap 160), whether the sensors 140 are deflected evenly (as in FIG. 8A) or deflected unevenly (as in FIG. 8B), as compared to the sensors 14 of microphone 10. As discussed below, the wall 150 can be provided by a corrugated section proximate to or at the distal or free end of the sensor 140.

Figure 9:
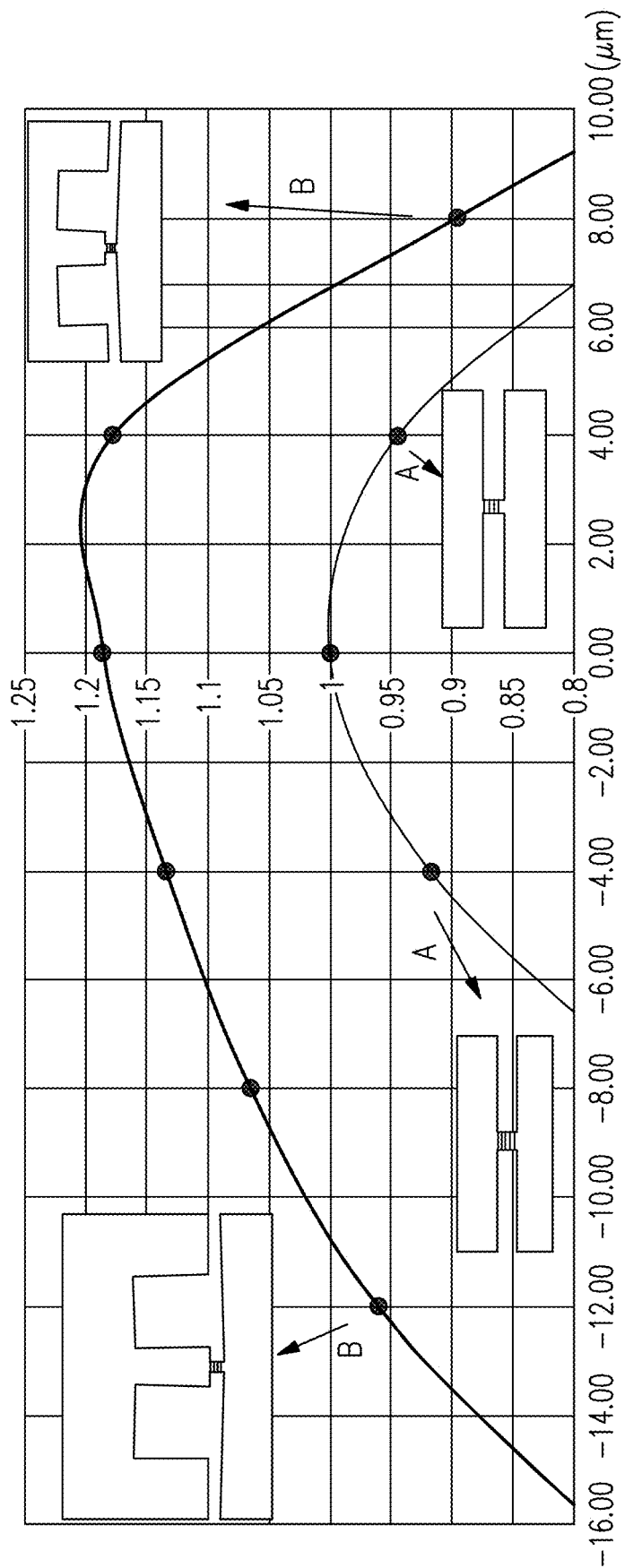
FIG. 9 is a graph of normalized acoustic resistance versus beam displacement for a sensor.

FIG. 9 shows a graph of normalized acoustic resistance (Y-axis) versus beam displacement of the sensor (X-axis, in μm), where a ±50 MPa internal stress variation would result in a ±8 μm bending of a 300 μm beam of a sensor (e.g., sensor 14, sensor 140). The graph shows that a sensor with a wall (e.g., a wall 5 μm in height) proximate (e.g., near) the distal or free end of the sensor (e.g., example B in FIG. 9) has a greater acoustic resistance than a sensor (like sensor 14) without such a wall (e.g., example A in FIG. 9). For example, at 0 displacement, the sensor with the wall has 20% greater acoustic resistance than the sensor without the wall. Accordingly, sensors with such generally transverse walls proximate the free or distal ends of the sensors advantageously allow the beams of the sensors to deflect by a greater amount to provide the same amount of acoustic resistance as a sensor without the wall. For example, if the device (e.g., microphone 10, 100) requires an acoustic resistance degradation of less than 20%, the margin of deflection of a flat beam (e.g., example A in FIG. 9) is ±6.5 μm (i.e., total deflection of 13 μm). In contrast, the margin of deflection for the beam with the generally transverse wall proximate the free or distal ends of the sensors (e.g., like sensors 140) would be approximately −15.5 μm to 9.5 μm (i.e., total deflection of 25 μm), or approximately 1.9 times that of the flat beam.

Figure 10A:
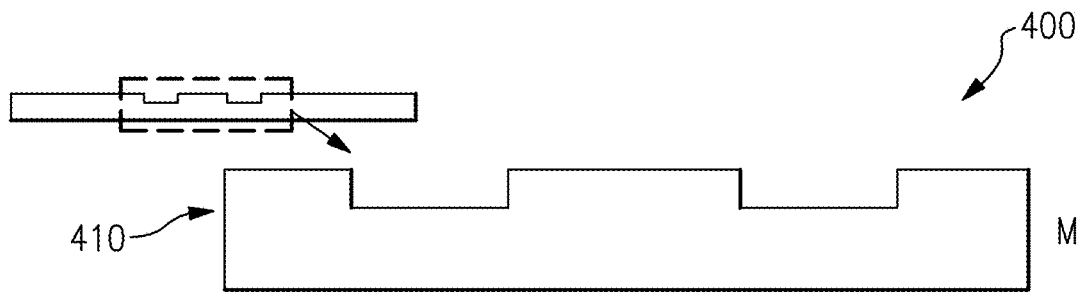
FIG. 10A is a cross-sectional side view of one step in the manufacture of a piezoelectric sensor.
Figure 10B:
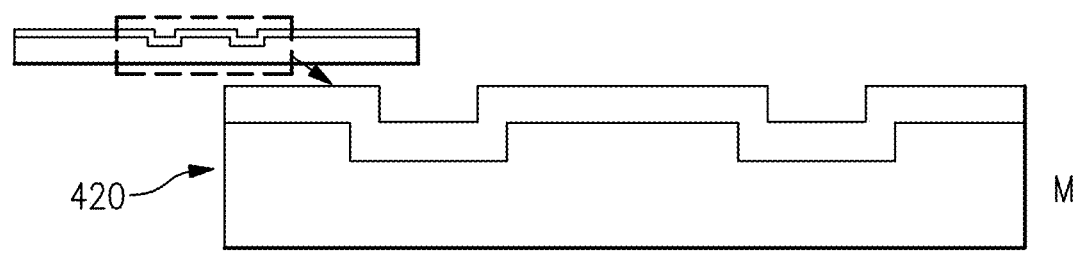
FIG. 10B is a cross-sectional side view of another step in the manufacture of a piezoelectric sensor.
Figure 10C:
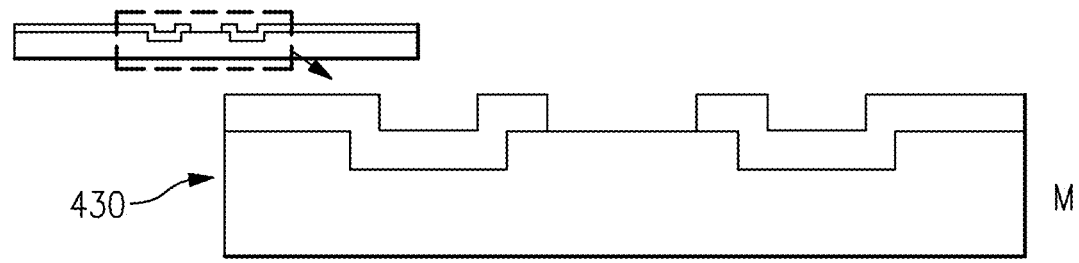
FIG. 10C is a cross-sectional side view of another step in the manufacture of a piezoelectric sensor.

FIGS. 10A-10D show cross-sectional views of structures illustrating steps of a method 400 of manufacturing one or more piezoelectric sensors (e.g., a pair of sensors), like the sensor 140A, with a corrugated section 150A (e.g., corrugated end section) at or proximate a distal or free end of the sensor 140A. FIGS. 10A-10C show cross-sections of the mold and beam in the lengthwise direction of the sensor 140A. The corrugated section 150A provides a wall at or proximate the free or distal end of the sensor 140A, which provides increased acoustic resistance for the gap between the sensors 140A (e.g., in a piezoelectric MEMS microphone) as compared with a sensor (such as sensor 14 in FIGS. 3A-3B) without such a wall.

FIG. 10A shows the step of forming or providing 410 a corrugated mold M, which can have two grooves formed therein (e.g., in a widthwise direction of the mold M). The mold M can in one implementation include silicon material; however, the mold M can be made of other suitable materials.

FIG. 10B shows the step of forming or depositing 420 a structure having one or more piezoelectric layers (e.g., one or more piezoelectric films) over the top surface of the mold M to define the sensor beam with a proximal portion and a distal portion, the distal portion having a corrugated section including one or more grooves that correspond to the one or more grooves of the mold M. For example, the one or more layers can be deposited onto the mold M by one of many methods used for deposition of thin films, such as physical vapor deposition (PVD), Electron Beam Evaporation, Plasma Enhanced Chemical Vapor Deposition (PECVD), furnace deposition processes or a combination of these methods.

FIG. 10C shows the step of forming 430 the gap (e.g., gap 160) in the structure. For example, the material of the structure can be etched to form the gap between two cantilevered sensor beams.

Figure 10D:
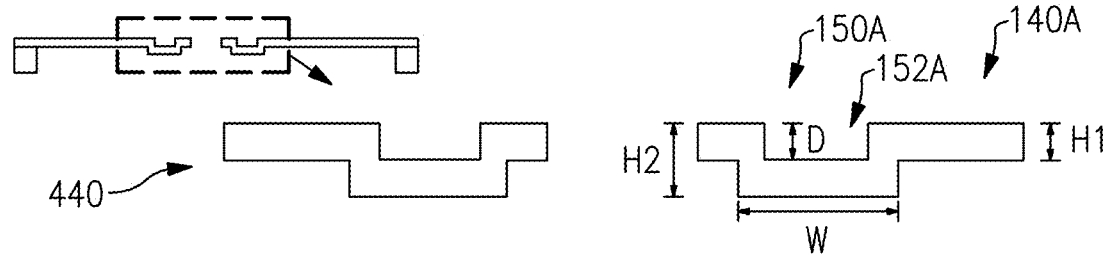
FIG. 10D is a cross-sectional side view of another step in the manufacture of a piezoelectric sensor.

FIG. 10D shows the step of releasing or removing 440 the structure from the mold M, leaving a portion of the beams 140A attached to a substrate in a cantilevered manner to provide the cantilevered beams 140A with the corrugated section 150A (e.g., corrugated end section) that can deflect, for example, when subjected to sound pressure. The corrugated section 150A can have one or more grooves 152A having a depth D and width W. The groove(s) 152A can extend in a direction generally transverse (e.g., perpendicular) to a length of the beam of the sensor 140A. The height H2 of the corrugated section 150A (e.g., of the one or more grooves 152A) is greater than a height H1 of the portion of the beam proximal of the corrugated section 150A. In one implementation, the height H2 of the corrugated section 150A (e.g., of the one or more grooves 152A) is approximately twice the height H1 of the portion of the beam proximal of the corrugated section 150A. However, the height H2 of the corrugated section 150A can be greater than the height H1 of the rest of the beam of the sensor 140A by other suitable amounts (e.g., 1.25 times, 1.5 times, 1.75 times). The corrugated section 150A can have an overhang portion distal of the groove 152A, which in one implementation can have a length of between 0.5 and 2.0 μm; other suitable lengths are possible. Optionally, the method 300 of forming the piezoelectric sensor(s) 140A with the cantilever beam(s) having the corrugated section 150A can be incorporated into a method for manufacturing a piezoelectric MEMS microphone, and include a step for forming on the substrate or attaching to the substrate the cantilevered beam 140A with the corrugated end section 150A.

Figure 11A:
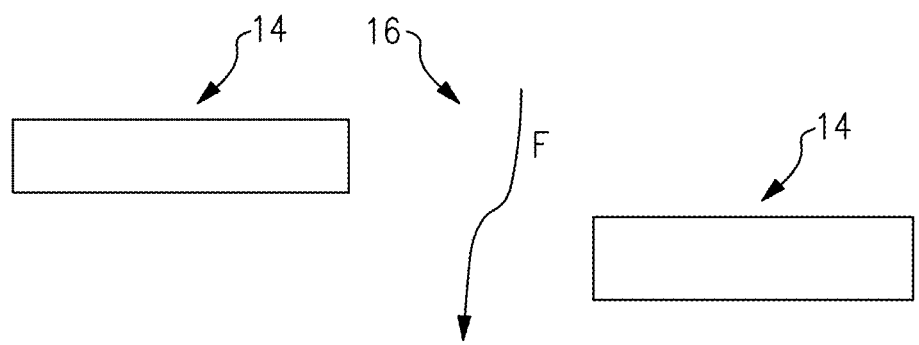
FIG. 11A is a schematic partial cross-sectional view of piezoelectric sensors deflected unevenly.
Figure 11B:
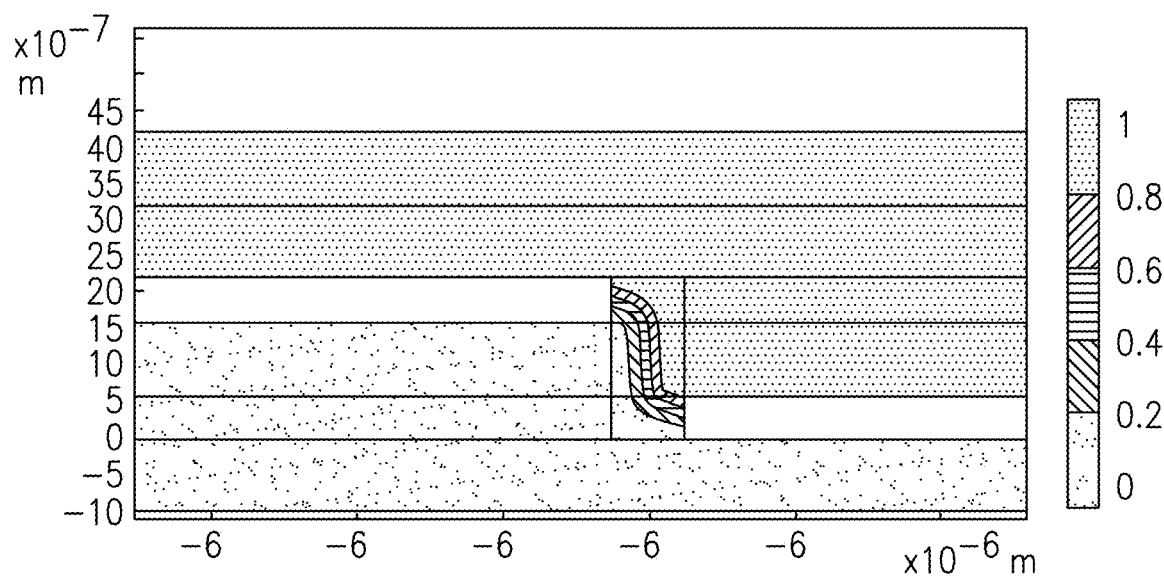
FIG. 11B is a graph of normalized acoustic resistance relative to distance from a center of the gap between two sensors and relative to a mismatch in vertical position between the two sensors.

FIG. 11A shows distal ends of the sensors 14 deflecting unevenly (e.g., by an unequal amount), which results in an increased gap 16 through which air flow F passes. FIG. 11B shows a graph of air pressure across the gap 16 based on distance from the gap (along X-axis) and mismatch (e.g., in vertical distance) between the sensors 14 (along Y axis). The air pressure changes through the gap. In examples where the gap is smaller, the gradient is narrower, indicating higher acoustic resistance.

Figure 12A:
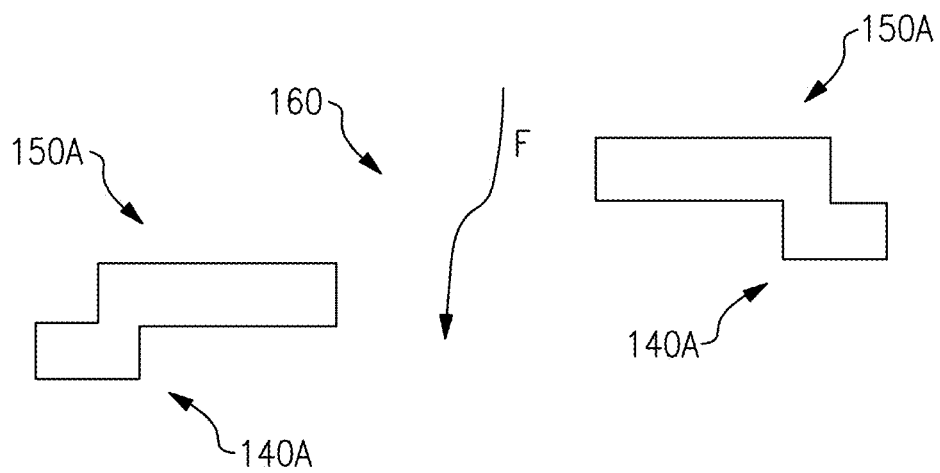
FIG. 12A is a schematic partial cross-sectional view of piezoelectric sensors with edge corrugation deflected unevenly.
Figure 12B:
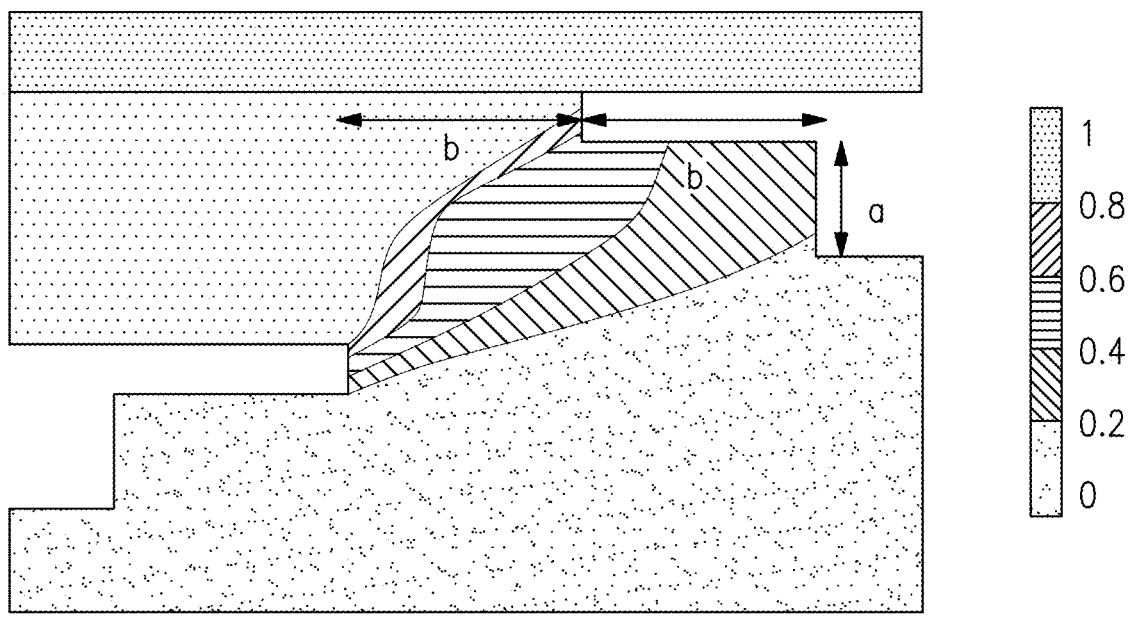
FIG. 12B is a graph is a graph of normalized acoustic resistance relative to distance from a center of the gap between two sensors and relative to a mismatch in vertical position between the two sensors.

FIG. 12A shows distal ends of the sensors 140A (e.g., with corrugated sections 150A) deflecting unevenly (e.g., by an unequal amount), which results in an increased gap 160 through which air flow F passes, but which has greater acoustic resistance than the flat beam in FIG. 11A. FIG. 12B shows a visual illustration of acoustic resistance for the gap 160 in FIG. 12A (using the same scale as in FIG. 11B), where "a" is the depth of the wall relative to the beam, "b" is the length of the overhang (e.g., of the corrugated section 150A) distal of the transverse or vertical wall, and "b" is also the horizontal distance (e.g., width) of the gap 160.

Figure 13:
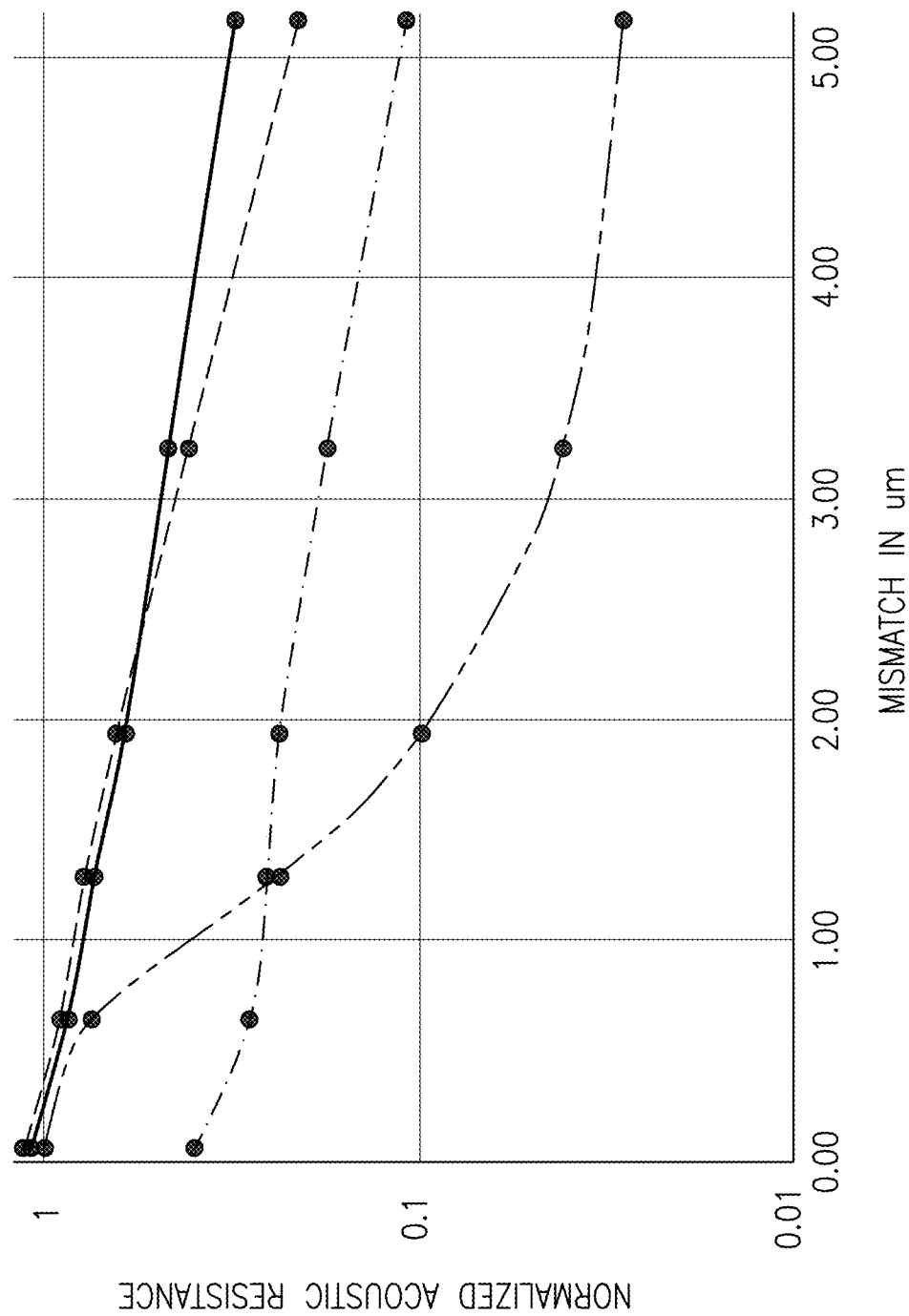
FIG. 13 is a graph of normalized acoustic resistance relative to mismatch in vertical distance between two sensors across a gap for various sensor designs.

FIG. 13 is a graph of normalized acoustic resistance relative to mismatch (in μm) between the deflection of sensors beams, where mismatch is measured vertically between the ends of the sensor beams. For example, a mismatch of 0 μm is where the two sensor beams on either side of the gap are at the same vertical location, a mismatch of 1 μm is where an end of one of the sensor beams is offset by 1 μm relative to an end of the other sensor beam on the other side of the gap between the beams, etc. With reference to the depth "a", overhang length "b" and gap width "b" in FIG. 12B, the curves in FIG. 13 are for sensors having different values for depth "a" of the transverse or vertical wall (e.g., provided by the corrugated section 150A), different values of the overhang length "b" and gap width "b". The solid line is for sensor beams with a=5 μm and b=1 μm. The dashed line is for sensor beams with a=2 μm and b=1 μm. The dash-dot-dash line is for sensor beams with a=2 μm and b=2 μm. The dash-dot-dot-dash line is for senor beams with a=0 μm and b=1 μm (e.g., linear sensors, such as sensor 14 without any transverse wall).

As shown in FIG. 13, the sensor beams (e.g., sensors 14) without any transverse or vertical wall (e.g., provided by a corrugated section) are most sensitive to the mismatch (e.g., to the uneven deflection of sensors); for example, for a mismatch of 2 μm, the acoustic resistance of such sensors (without transverse or vertical walls) decreases approximately 90%. Additionally, as shown in the difference between the dashed lines and the dash-dot-dash lines, for which the sensor beams have the transverse or vertical wall of the same depth but where the overhang is larger in the dash-dot-dash line, the longer the overhang length is (e.g., the farther the transverse wall is from the distal or free end of the sensor beams) the more the acoustic resistance will drop for a particular mismatch between the deflection of the sensor beams. At a mismatch of 2 μm, the dashed lines has a drop in acoustic resistance of approximately 10%. Additionally, the longer the transverse or vertical wall is, the less the acoustic resistance will drop, particularly at greater mismatch values (e.g., greater than about 2.5 μm). Therefore, even where the sensor beams deflect unequally or unevenly, sensors (e.g. sensors 140A) with corrugated end sections 150A provide increased acoustic resistance relative to sensors (e.g., sensors 14) without corrugated end section or transverse or vertical walls.

FIGS. 14A-14E show cross-sectional views of structures illustrating steps of a method 500 of manufacturing one or more piezoelectric sensors (e.g., a pair of sensors), like the sensor 140B, with a corrugated section 150B (e.g., corrugated end section) at or proximate a distal or free end of the sensor 140B. FIGS. 14A-14E show cross-sections of the mold and beam in the lengthwise direction of the sensor 140B. The corrugated section 150B provides a wall at or proximate the free or distal end of the sensor 140B, which provides increased acoustic resistance for the gap between the sensors 140B (e.g., in a piezoelectric MEMS microphone) as compared with a sensor (such as sensor 14 in FIGS. 3A-3B) without such a wall.

Figure 14A:
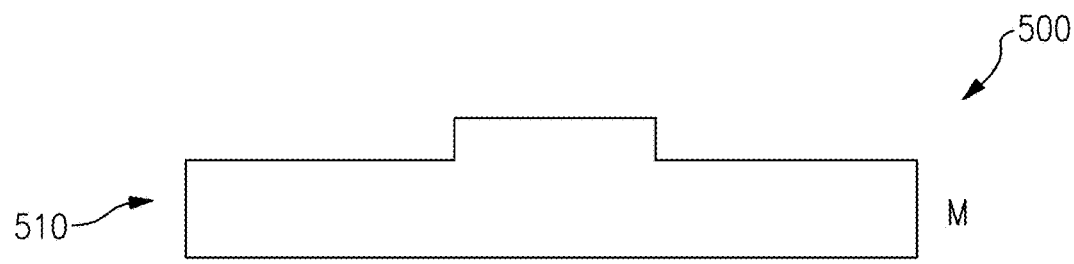
FIG. 14A is a cross-sectional side view of one step in the manufacture of a piezoelectric sensor.
Figure 14B:
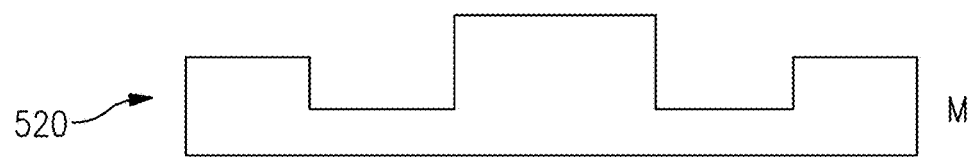
FIG. 14B is a cross-sectional side view of another step in the manufacture of a piezoelectric sensor.
Figure 14C:
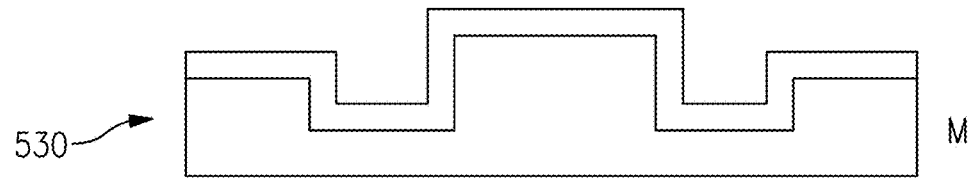
FIG. 14C is a cross-sectional side view of another step in the manufacture of a piezoelectric sensor.
Figure 14D:
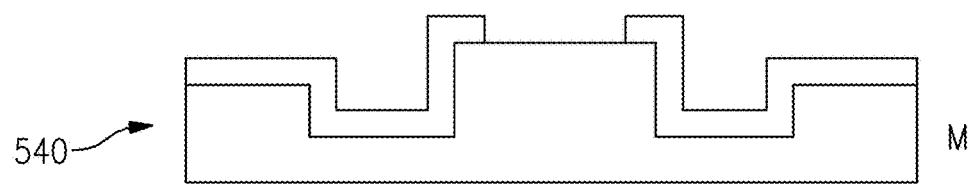
FIG. 14D is a cross-sectional side view of another step in the manufacture of a piezoelectric sensor.
Figure 14E:
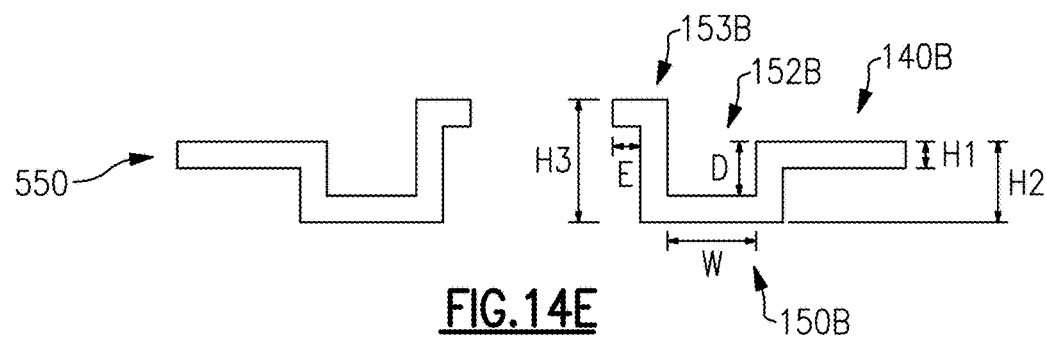
FIG. 14E is a cross-sectional side view of another step in the manufacture of a piezoelectric sensor.

FIG. 14A shows the step of forming or providing 510 a corrugated mold M, which can have a stepped portion (e.g., generally at the center of the mold M). The mold M can in one implementation include silicon material; however, the mold M can be made of other suitable materials. FIG. 14B shows the step of forming 520 grooves in the mold M on either side of the stepped portion (e.g., in a widthwise direction of the mold M). FIG. 14C shows the step of forming or depositing 530 a structure having one or more piezoelectric layers (e.g., one or more piezoelectric films) over the top surface of the mold M to define the sensor beam with a proximal portion and a distal portion, the distal portion having a corrugated section including one or more grooves that correspond to the one or more grooves of the mold M. For example, the one or more layers can be deposited onto the mold M (e.g., over the stepped portion, inside the grooves) by one of many methods used for deposition of thin films, such as physical vapor deposition (PVD), Electron Beam Evaporation, Plasma Enhanced Chemical Vapor Deposition (PECVD), furnace deposition processes or a combination of these methods. FIG. 14D shows the step of forming 540 the gap in the structure. For example, the material of the structure over the stepped portion can be etched to form the gap between two cantilevered sensor beams. FIG. 14E shows the step of releasing or removing 550 the structure from the mold M, leaving a portion of the beams 140B attached to a substrate in a cantilevered manner to provide the cantilevered beams 140B with the corrugated section 150B (e.g., corrugated end section) from the mold M that can deflect, for example, when subjected to sound pressure.

The corrugated section 150B can have one or more grooves 152B having a depth D and width W and an end wall portion 153B with a height H3 and overhang length E. The groove(s) 152B can extend in a direction generally transverse (e.g., perpendicular) to a length of the beam of the sensor 140B. The height H2 of the corrugated section 150B (e.g., of the one or more grooves 152B) is greater than a height H1 of the portion of the beam proximal of the corrugated section 150B. The height H3 of the end wall portion 153B can be greater than the height H2. In one implementation, the height H2 of the corrugated section 150B (e.g., of the one or more grooves 152B) is approximately twice the height H1 of the portion of the beam proximal of the corrugated section 150B. However, the height H2 of the corrugated section 150B can be greater than the height H1 of the rest of the beam of the sensor 140B by other suitable amounts (e.g., 1.25 times, 1.5 times, 1.75 times). The overhang E can have a length of between 0.5 and 2.0 μm; other suitable lengths are possible.

Optionally, the method 500 of forming the piezoelectric sensor(s) 140B with the cantilevered beam(s) having the corrugated section 150B can be incorporated into a method for manufacturing a piezoelectric MEMS microphone, and include a step for forming on the substrate or attaching to the substrate the cantilevered beam 140B with the corrugated end section 150B.

FIGS. 15-18 show different implementation of sensors (e.g., piezoelectric sensors) that can be used in acoustic devices (e.g., piezoelectric MEMS microphones) and can exhibit increased acoustic resistance across the gap between the sensors as compared to linear sensors, such as sensors 14, without a transverse or vertical wall as described above.

Figure 15:
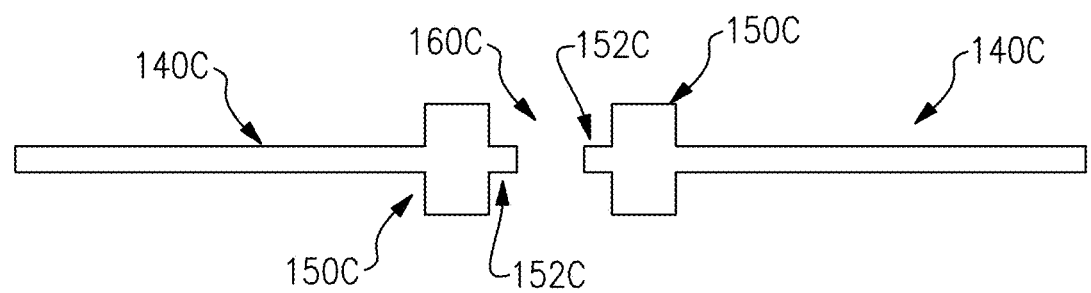
FIG. 15 is a schematic cross-sectional side view of a piezoelectric sensor.

FIG. 15 shows sensors 140C with transverse (e.g., vertical) walls 150C that extend from a top surface and a bottom surface of the sensors 140C. Distal beam portions 152C extend from the walls 150C to the distal or free ends of the sensors 140C on either side of the gap 160C between the sensors 140C.

Figure 16:
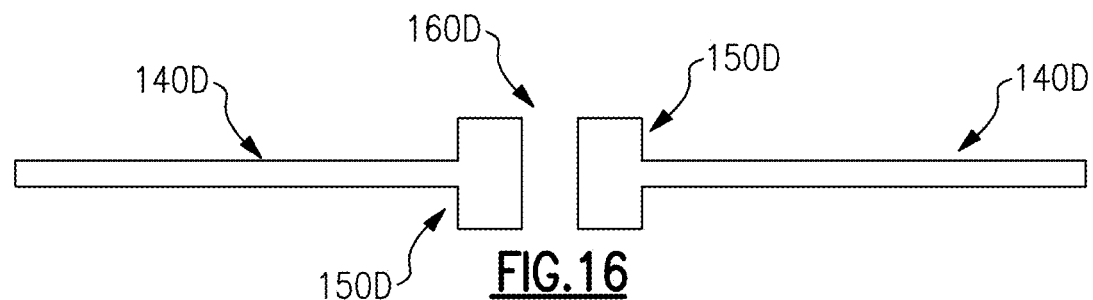
FIG. 16 is a schematic cross-sectional side view of a piezoelectric sensor.

FIG. 16 shows sensors 140D with transverse (e.g., vertical) walls 150D that extend from a top surface and a bottom surface of the sensors 140D. The walls 150D are at the distal or free ends of the sensors 140D so that the walls 150D define the distal or free end of the sensors 140D on either side of the gap 160D between the sensors 140D.

Figure 17:
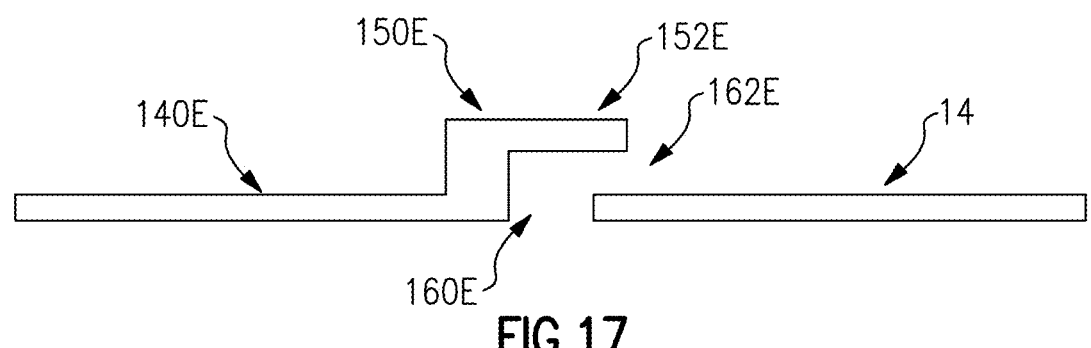
FIG. 17 is a schematic cross-sectional side view of a piezoelectric sensor.

FIG. 17 shows one sensor 14 that is linear (e.g., flat) and does not have a transverse or vertical wall relative to the length of the sensor 14. FIG. 17 also shows a sensor 140E opposite the sensor 14 across the gap 160E. The sensor 140E has a transverse (e.g., vertical) wall 150E with an overhang portion 152E that extends over the gap 160E and a distal end of the sensor 14 to a distal or free end of the sensor 140E. A distance between the end of the overhang portion 152E and the sensor 14 defines a vertical gap 162E between the sensor 14 and sensor 140E.

Figure 18:
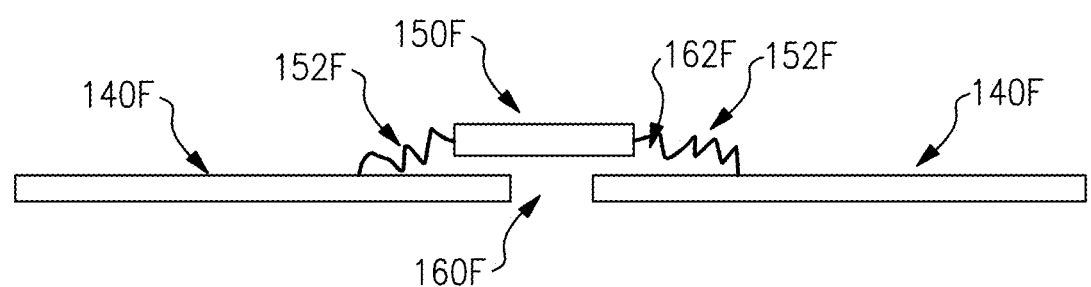
FIG. 18 is a schematic cross-sectional side view of a piezoelectric sensor.

FIG. 18 shows linear sensors 140F that extend to distal or free ends across a gap 160F from each other. An overhang portion 150F is disposed above and overlaps with the distal ends of the sensors 160F, where the overhang portion 150F is movably coupled to the sensors 140F by springs 152F. The springs 152F can be soft springs that allow the overhang portion 150F to move relative to the distal ends of the sensors 140F. A distance between ends of the overhang portion 150F and the sensors 140F defines a vertical gap 162F between the overhang portion 150F and the sensors 140F.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A method of making a piezoelectric sensor for a piezoelectric microelectromechanical systems microphone, comprising:
   forming or providing a mold extending along a length and having one or more grooves in a top surface of the mold, the one or more grooves extending in a direction of the length of the mold to a distal end of the mold;
   forming or depositing a structure having one or more piezoelectric layers over the top surface of the mold to define a beam with a proximal portion and a distal portion, the distal portion having a corrugated section including one or more grooves that correspond to the grooves of the mold;
   forming a gap in the structure to define two beams with free ends separated by the gap; and
   releasing the structure from the mold to form two cantilever beams having said free ends separated by the gap, the two cantilever beams configured to move independently of each other.

2. The method of claim 1 further comprising forming or applying an electrode to the proximal portion of the structure.

3. The method of claim 1 wherein the corrugated section has two grooves, the gap formed between the two grooves.

4. The method of claim 3 wherein the two grooves extend parallel to each other in a second direction generally transverse to the first direction.

5. The method of claim 1 wherein a thickness of the beam between a top surface and a bottom surface is greater in the corrugated section than in the proximal portion of the beam.

6. The method of claim 1 wherein the one or more grooves defines a wall portion of the beam that extends perpendicular to the first direction.

7. The method of claim 6 wherein the wall portion extends downward relative to a bottom side of the beam.

8. The method of claim 1 further comprising forming or providing a stepped portion on the mold prior to forming the one or more grooves in the mold.

9. The method of claim 8 wherein the one or more grooves defines a wall portion of the beam that extends perpendicular to the first direction, the wall portion extending upward relative to a top side of the beam and downward relative to a bottom side of the beam.

10. A method of making an electronic device, comprising:
    forming or providing a printed circuit board that includes a substrate layer;
    forming or providing one or more piezoelectric microelectromechanical systems microphones via a process including (a) forming or providing a mold extending along a length and having one or more grooves in a top surface of the mold, the one or more grooves extending in a direction of the length of the mold to a distal end of the mold, (b) forming or depositing a structure having one or more piezoelectric layers over the top surface of the mold to define a beam with a proximal portion and a distal portion, the distal portion having a corrugated section including one or more grooves that correspond to the one or more grooves of the mold, (c) forming a gap in the structure to define two beams with free ends separated by the gap, (d) releasing the structure from the mold, and (d) leaving a part of the structure attached to a substrate in a cantilevered manner to form two cantilever beams having said free ends separated by the gap, the two cantilever beams configured to deflect independently of each other when subjected to sound pressure; and
    mounting the one or more piezoelectric microelectromechanical systems microphones on the printed circuit board.

11. The method of claim 10 further comprising forming or applying an electrode to the proximal portion of the structure.

12. The method of claim 10 wherein the corrugated section has two grooves, the gap formed between the two grooves.

13. The method of claim 12 wherein the two grooves extend parallel to each other in a second direction generally transverse to the first direction.

14. The method of claim 10 wherein a thickness of the beam between a top surface and a bottom surface is greater in the corrugated section than in the proximal portion of the beam.

15. The method of claim 10 wherein the one or more grooves defines a wall portion of the beam that extends perpendicular to the first direction.

16. The method of claim 15 wherein the wall portion extends downward relative to a bottom side of the beam.

17. The method of claim 10 further comprising forming or providing a stepped portion on the mold prior to forming the one or more grooves in the mold.

18. The method of claim 17 wherein the one or more grooves defines a wall portion of the beam that extends perpendicular to the first direction, the wall portion extending upward relative to a top side of the beam and downward relative to a bottom side of the beam.

* * * * *